United States Patent [19]

Wakamiya et al.

[11] Patent Number: 4,833,776
[45] Date of Patent: May 30, 1989

[54] TACTILE RETRIEVAL AND INSERTION AND METHOD FOR ELECTRONIC COMPONENTS IN THROUGH-HOLE PRINTED CIRCUIT BOARDS

[75] Inventors: Stanley K. Wakamiya; Fred S. Blake, both of Ellicott City; John O. Kurtz, Woodstock, all of Md.

[73] Assignee: Westinghouse Electric Corp., Pittsburgh, Pa.

[21] Appl. No.: 149,769

[22] Filed: Jan. 29, 1988

[51] Int. Cl.[4] .................................. H05K 3/30
[52] U.S. Cl. ............................. 29/837; 29/593; 29/714; 29/741; 29/762
[58] Field of Search .......... 29/593, 741, 762, 837–839, 29/759, 714

[56] References Cited

U.S. PATENT DOCUMENTS

| | | |
|---|---|---|
| 2,964,749 | 12/1960 | Kwasniewski et al. |
| 3,253,327 | 5/1966 | McElligatt. |
| 3,401,548 | 9/1968 | Ross et al. ............................ 72/389 |
| 3,593,404 | 7/1971 | Ragard. |
| 4,179,803 | 12/1979 | Wolkert ................................ 29/741 |
| 4,202,092 | 5/1980 | Shibasaki et al. ................. 29/741 |
| 4,218,817 | 8/1980 | Takano ................................ 29/741 |
| 4,286,380 | 9/1981 | Blount ................................. 29/741 |
| 4,329,776 | 5/1982 | Mori et al. .......................... 29/741 |
| 4,472,668 | 9/1984 | Mutschler et al. ................ 318/568 |
| 4,625,399 | 12/1986 | Zemek et al. ...................... 29/845 |
| 4,653,794 | 3/1987 | Atlas ................................... 294/88 |

Primary Examiner—Carl E. Hall
Attorney, Agent, or Firm—W. G. Sutcliff

[57] ABSTRACT

The electronic component retrieval and insertion apparatus for printed circuit boards is a tactile and displacement monitoring device for the retrieval from a source and insertion of electronic components into a through-hole PCB utilizing force and displacement sensors on extendable fingers adjustable for a multitude of shapes such that excessive force to the component and PCB can be avoided and the final position of the inserted component can be checked to verify proper seating.

14 Claims, 6 Drawing Sheets

TACTILE RETRIEVAL AND INSERTION AND METHOD FOR ELECTRONIC COMPONENTS IN THROUGH-HOLE PRINTED CIRCUIT BOARDS

BACKGROUND OF THE INVENTION

The present invention relates to an apparatus for automatically retrieving from a supply and inserting various types and sizes of electronic components having extending lead wires into predetermined apertures in a through-hole printed circuit board. Specifically the apparatus of the present invention includes a retrieval and insertion device with adjustable pairs of fingers with force and displacement sensors to carefully monitor and control the force exerted on and the displacement of components having different shapes during retrieval and insertion of these components into the proper location on a printed circuit board.

Automatic electronic component insertion apparatus for printed circuit boards are well known. Some insertion apparatus manipulate components based solely on a predetermined path such that upon occasional and slight deviation from that path, an insertion may be attempted without proper alignment of the component lead with the printed circuit board through-hole. In this situation either the component or the printed circuit board could be damaged. These apparatus function largely in an assembly line mode in which large numbers of similarly shaped components are sequentially positioned on a printed circuit board, and if a component becomes damaged or a printed circuit board becomes damaged during this process, then it is possible that the component or entire printed circuit board may have to be discarded. Because the focus of the assembly is on volume and not the value of individual components, a damaged component that must be discarded causes minimal economic loss in the overall assembly process. One technique of monitoring the force of the insertion apparatus on a component involves the use of strain gages on a printed circuit board support table such that excessive force on the component would be translated through the printed circuit board (PCB) to the support table and detected through the attached strain gages. While this is effective, it is fairly complex and a simpler method is needed.

Furthermore, some apparatus may occasionally insert a component improperly, such as in a cocked position, and this misplacement is discovered only after the component has been clinched or soldered to the PCB among a closely spaced field of other electronic components. Consequently, removal of this component may act to damage adjacent components.

Also, during the insertion process different apparatus utilize different techniques to determine whether or not the component leads are properly aligned with their respective holes before insertion. One technique involves the use of complex light detectors that sends light directed from the underside of a through-hole PCB and aligns the component leads based on information supplied by the light detectors. While this method may be effective a simpler and more direct method is needed.

Furthermore, many apparatus are designed to accommodate only one type of electrical component such as an axial component, and provide for other components through the substitution of a gripping device designed solely for the new component configuration.

An object of this invention is to provide an apparatus capable of positioning an electronic component on a through-hole PCB through the use of tactile sensors to limit the insertion force and removing that force if it is determined that a component is not capable of insertion into the PCB.

Another object of this invention is to provide an apparatus capable of sensing incorrect insertion of a component during the insertion process and providing an opportunity for retraction of the component or reinsertion of the component at another location.

Another object of this invention is to provide an apparatus capable of confirming that a component has been properly retrieved from a supply and properly inserted into a PCB.

Still another object of this invention is to provide an apparatus capable of permitting the retrieval and insertion into a through-hole PCB of a variety of differently sized and shaped electronic components, such as axial components, can-type components, or radial components.

SUMMARY OF THE INVENTION

The electronic component retrieval and insertion apparatus for printed circuit boards is a tactile and displacement monitoring device for the retrieval from a source and insertion of electronic components into a through-hole PCB utilizing force and displacement sensors on extendable fingers adjustable for a multitude of shapes such that excessive force to the component and PCB can be avoided and the final position of the inserted component can be checked to verify proper seating.

BRIEF DESCRIPTION OF THE DRAWINGS

The present invention will be better understood with reference to the drawings of which.

DESCRIPTION OF THE INVENTION

Figure 1:
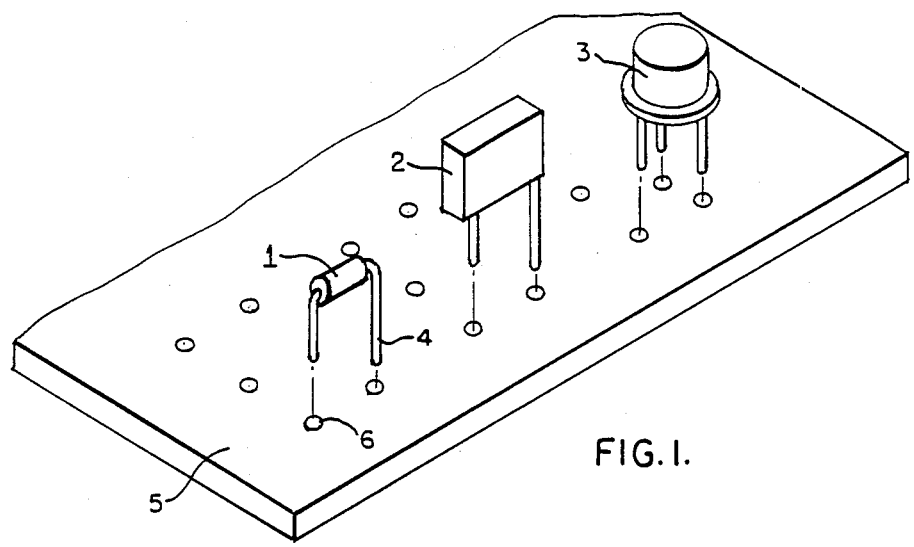
FIG. 1 is an isometric view showing some of the components the apparatus is capable of retrieving and inserting into printed circuit boards.

The apparatus is capable of inserting electronic components having a variety of shapes into the appropriate locations on a through-hole PCB. FIG. 1 shows three common component shapes representing an axial component 1, a radial component 2 and a can-type component 3 having leads 4 situated above a PCB 5 for insertion through the holes 6 in a PCB 5. Note the leads 4 of each component are different lengths. This is purposefully done to facilitate insertion by allowing the leads 4 to be pushed through the PCB 5 one at a time. Furthermore, orientations of a component may be determined through optical scanning and the orientation adjusted when the component is retrieved so the component may be properly aligned with the respective holes in a PCB.

Figure 2:
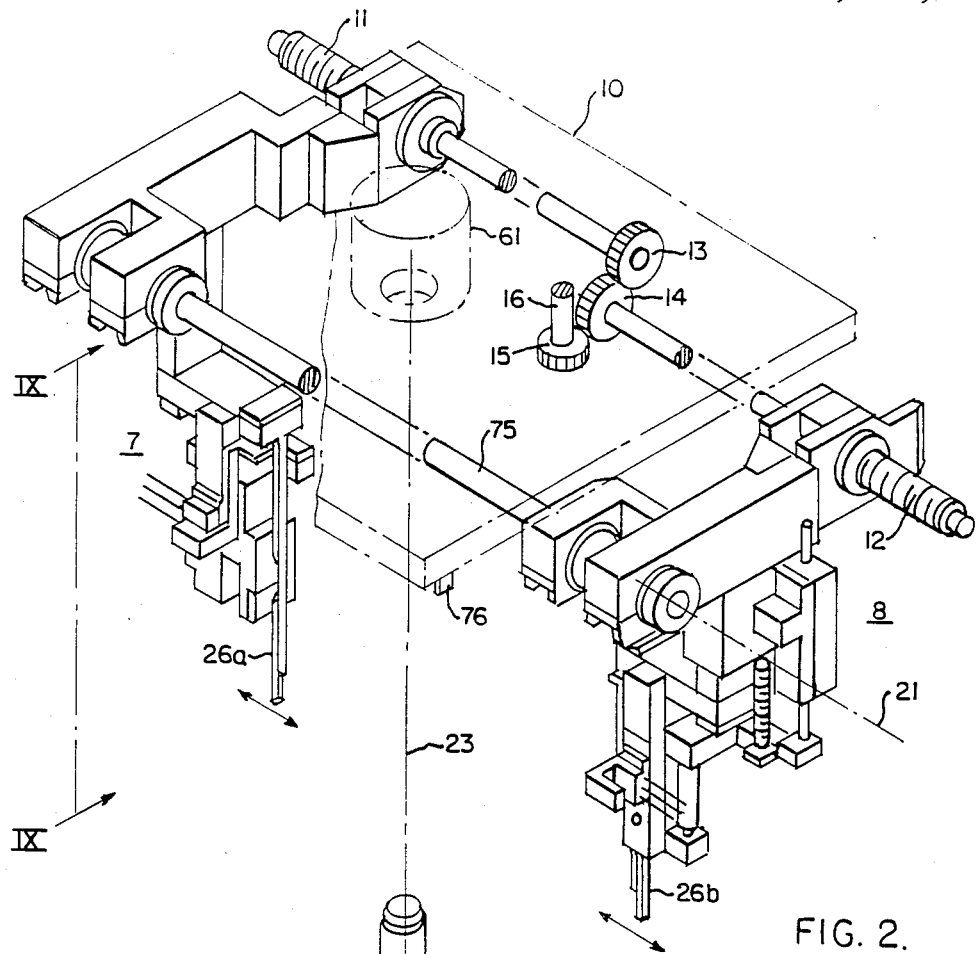
FIG. 2 is an exploded isometric view of the entire apparatus showing the interrelationship between the respective assemblies of the apparatus.
Figure 2:
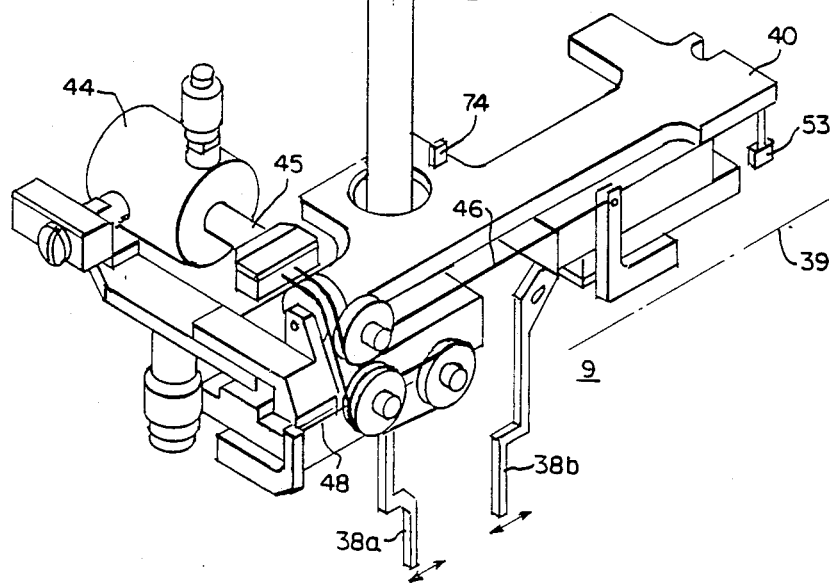
Figure 9:
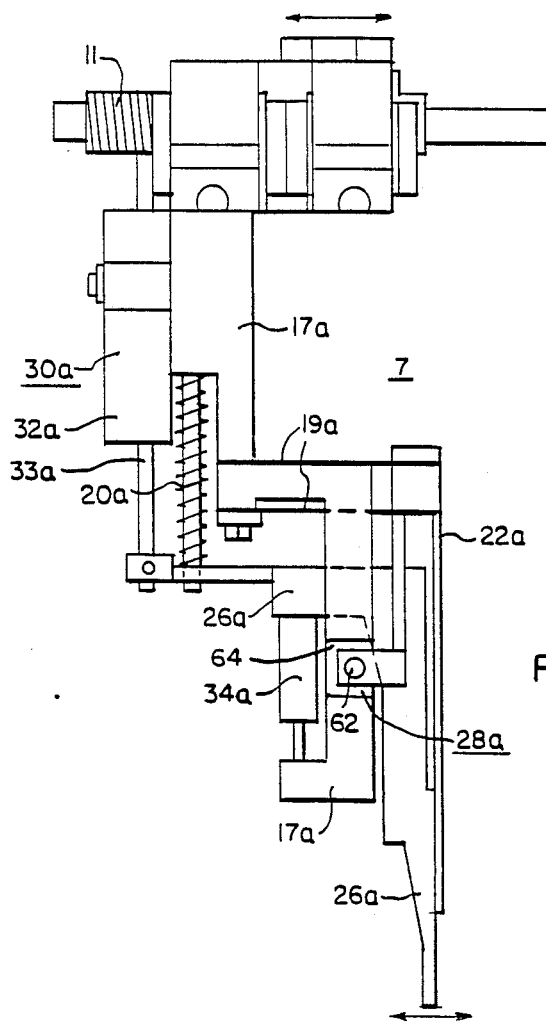
FIG. 9 is a side view taken from item 7, the servo-finger assembly, in FIG. 2 to illustrate the operation of the servo-finger assembly.

In order to better understand the apparatus, an exploded view showing the four major parts of the apparatus is shown in FIG. 2 and will be explained. A mechanical arm (not shown), such as that used in a robotics system, supports and guides the entire apparatus through attachment to an interface plate 10. The apparatus is entirely compatible to be used as an end-effector on a robotic arm and a preferred use of the apparatus is as an end-effector. Feedback from sensors and control cables to motors on the apparatus are routed to a controller, such as a computer, and the controller determines how the apparatus will be moved and when the motors will be activated. The interface plate 10 is used to support a pair of servo-motor driven finger assemblies 7 and 8 and a pneumatically driven finger assembly 9. For clarification a schematic of the servo-motor driven finger assemblies 7, 8 and the pneumatically driven finger assembly g will be presented later. Note assemblies 7 and 8 are essentially mirror images of each other and therefore an explanation of only one is necessary. Furthermore, a side view of servo-motor driven finger assembly 7 shown in FIG. 9 will be used to illustrate the operation of the assemblies 7 and 8 and, therefore, the isometric view in FIG. 2 of these assemblies should be used only to illustrate the relative position of the assemblies.

Figure 3:
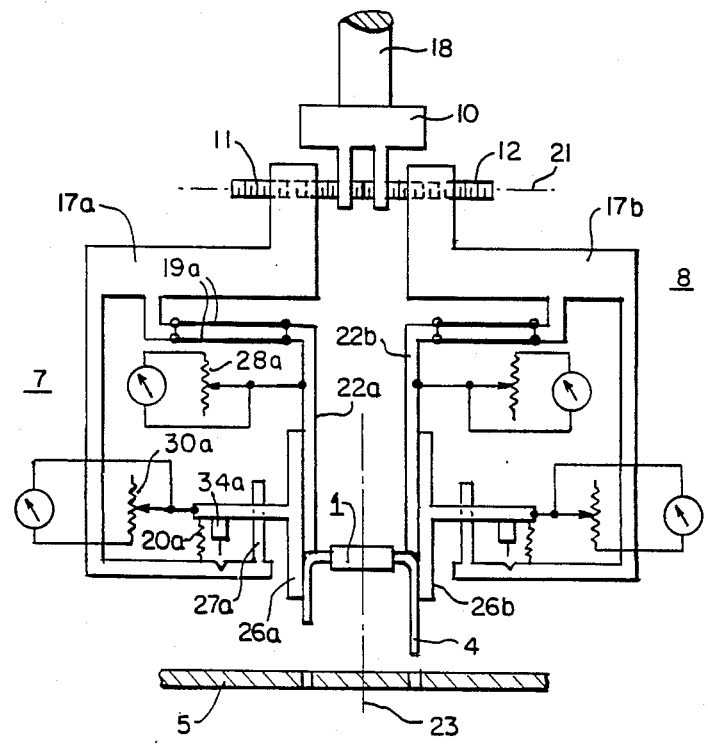
FIG. 3 is a schematic of the servo-finger assemblies indicated by items 7 and 8 on FIG. 2.

The servo-motor driven finger assemblies, 7 and 8, hereinafter called the servo-finger assemblies are shown in schematic in FIG. 3. Note that while the retrieval and insertion apparatus is capable of handling a variety of differently shaped components, an axial component 1 will be used as an example for insertion into a through-hole PCB 5. The schematic in FIG. 3 shows an axial component 1 already grasped and located above and perpendicular to the PCB 5. The sequence of component retrieval and insertion, of which this schematic shows only an instant in the sequence, will be described later.

Generally, to an interface plate 10 is attached a pair of lead screws 11, 12. Note while item 10 is referred to as a plate, the shape may be any appropriate configuration. Through a gearing arrangement not shown in this schematic, but shown in FIG. 2, lead screws 11 and 12 have at their common end single helical gears 13 and 14 that mesh with one another and are driven by a pinion gear 15. The pinion gear 15 is attached to a drive shaft 16. Through rotation of the shaft 16, the servo-finger assemblies 7 and 8 are moved together or apart in a direction parallel to a first axis 21. The shaft 16 is controlled, using a servo-motor (not shown) mounted on the interface plate 10 to provide close control of the advance and retreat of frames 17a and 17b (FIG. 3) which control the grasp of the assemblies. Assemblies 7 and 8 are referred to as servo-finger assemblies because the frames 17a and 17b are controlled by a servo-motor. A mechanical arm 18, such as that used in a robotic system, is connected to the interface plate 10 and acts to support and move the entire retrieval and insertion apparatus. Note that mechanical arm 18 is not shown in FIG. 2 but would be connected to the plate 10 in FIG. 2. The left frame 17a and the right frame 17b are attached to the lead screws 11, 12 through internal threads (not shown) in the frames 17a and 17b. Because all of the elements of both frames 17a, 17b are identical but opposite, frame 17a will be generally discussed with frame 17b distinguished when helpful. Note that the frame 17a elements will have the "a" suffix while the frame 17b elements will have the "b" suffix. Frame 17a has attached to it two separate springs 19a and 20a. Spring 19a, actually a pair of rectangular leaf springs, is cantilevered and secured to the frame 17a at one end. The other end of the spring 19a supports a long finger 22a which will be referred to as a pusher 22a. Item 22 actually includes a subframe that is comprised of a finger and an extension on the finger to attach a displacement sensor 28a. Another finger 26a is slidably mounted to a post 27a on the frame 17a and located such that it slidably abuts pusher 22a along a longitudinal V-shaped slot in finger 26a into which pusher 22a, with its own V-shaped mating taper fits (see FIGS. 5A and 6). In actuality the item 26a includes a subframe that is comprised of a finger and extensions on the finger to attach a coil spring 20a, a slider post 33a and a pneumatic cylinder 34a. This entire subframe will be referred to as finger 26a. Note it is the V-shaped slot which permits the fingers 26a and 26b to grasp the leads and at the same time center the axial component 1 within the fingers 26a and 26b. Note also the normal rest position of pushers 22a, 22b and fingers 26a, 26b in the absence of any force on them is extended downward. At this point for reference a second axis 23 will be defined which is perpendicular to the first axis 21. This axis 23 will be considered to be a vertical axis. Both of these axes are also shown in FIG. 2. A coil spring 20a is attached to the frame 17a and to the finger 26a such that any relative motion between the finger 26a and the frame 17a caused as the finger 26a moves along the post 27a is resisted by the force of the spring 20a. With the frame 17a as a foundation both pusher 22a and finger 26a may independently vertically slide parallel to axis 23, resisted only by the spring force of their respective springs 19a and 20a. Note that although spring 19a is a leaf spring and spring 20a is a coil spring these types of springs are only representative and these or other spring types may be adequate for proper function of the invention. The displacement of the pusher 22a and finger 26a relative to the frame 17a are measured with sensitive displacement sensors 28a and 30a, respectively. These sensors 28a and 30a are both rigidly attached to the frame 17a such that any displacement of the pusher 22a or the finger 26a, which may only occur in a direction parallel to axis 23, will be detected. The physical location and attachment of the displacement sensors 28a and 30a will be discussed later with FIG. 9. A pneumatic cylinder 34a attached to finger 26a can be activated causing the finger 26a to move upward relative to the frame 17a, totally independent of the movement of the pusher 22a.

Fingers 26a and 26b, using lead screws 11 and 12, are laterally moved parallel to the first axis 21 to close on the axial component 1 leads and hold them. Note the longitudinal V-shaped slots in fingers 26a and 26b (see FIGS. 5A and 6) act to hold the lead and also to center the component. Furthermore, the servo-motor which drives shaft 16 is supplemented with an integral optical encoder to provide precise control of the lateral movement of fingers 26a and 26b such that the axial component 1 leads may be grasped and compressed to a precise position before insertion into the PCB 5. The mechanical arm 18 then lowers both assemblies 7 and 8, which holds the component 1, such that the component 1 is inserted into the holes of the through-hole PCB 5.

Note that without the component 1 in place the pusher 22a, 22b and fingers 26a, 26b are free to move such that an upward force placed on any of the pushers or the fingers would result in totally independent displacement of that pusher or that finger and the quantity of this displacement, relative to the frame 17a or 17b, could be determined using the sensitive displacement sensors 28a, 28b or 30a, 30b. The values of these displacements are critical because not only will they be utilized to determine whether or not a component has been grasped properly, but they also may be utilized to verify that a component has been seated in the PCB properly and that excessive force is not utilized during the handling of a component. The force determination is possible simply because the spring constant in conjunction with the spring displacement permits a calculation to determine force. During the component 1 pickup the grasping force of the fingers 26a, 26b can be adjusted by varying the current supplied to the servomotor.

Overall the operation of the retrieval and insertion apparatus may be best presented utilizing FIG. 4 to show the different stages of retrieval from a source and insertion of an axial component 1 into a PCB 5.

Figure 4A:
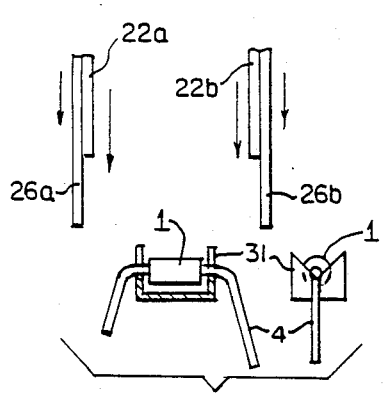
FIG. 4 shows schematics of the series of sequences required for the entire retrieval and insertion process of an electronic component.

FIG. 4A shows a pair of servo-fingers 26a, 26b slidably mounted to the servo-finger assemblies 7 and 8, respectively (see FIG. 3), which in turn are attached to a common interface plate (see 10 in FIG. 3). The pair of servo-fingers 26a, 26b is capable of vertical motion independent of the interface plate by overcoming spring forces acting vertically on each finger. The fingers 26a, 26b may be opened or closed through lateral motion controlled by the servo-motor. Two pushers 22a, 22b also mounted to the common interface plate, are capable of limited vertical motion by overcoming spring forces. These pushers move laterally with the fingers 26a, 26b. Since both sets of fingers are mounted to a common interface plate, any movement of the interface plate would move both sets of fingers as a unit. Furthermore, the relative movement of each finger 26a, 26b and each pusher 22a, 22b relative to the interface plate is closely monitored with displacement sensors. Note that in these diagrams that arrows will be used to assist in illustrating the absolute direction of travel of the pushers 22a, 22b and the fingers 26a, 26b.

Figure 4B:
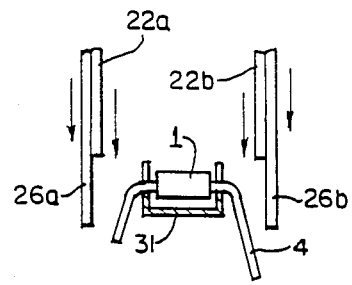
Figure 4C:
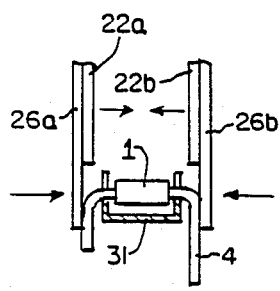
Figure 4D:
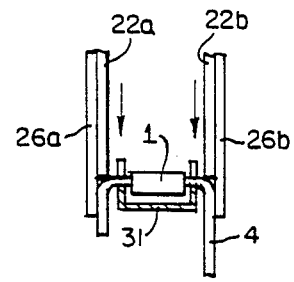
Figure 4E:
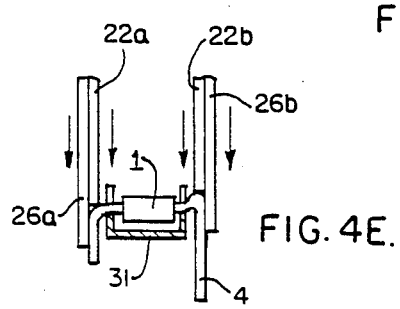
Figure 4F:
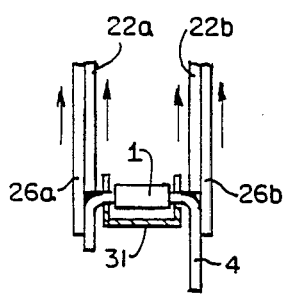

For component retrieval the fingers 26a, 26b and pushers 22a, 22b are spread apart and lowered directly over the component 1, which is supported and resting in a parts tray represented by 31 in FIG. 4A. The fingers 26a, 26b and pushers 22a, 22b are lowered via the interface plate a fixed distance until the fingers 26a, 26b are at a level at which they may grab the component 1 (FIG. 4B). The fingers 26a, 26b are then closed onto the component 1 such that the fingers 26a, 26b contact the leads 4 and slightly bend the component leads 4 inward to match the distance between the mating holes in the PCB (FIG. 4C). The fingers 26a, 26b now are holding the component 1 firmly by the leads and, as indicated, the component resting in a tray is independently supported on its leads 4 such that the fingers 26a, 26b and the pushers 22a, 22b cannot displace the component 1 downward. Because of this when the interface plate (10 in FIG. 3), which supports the servo-finger assemblies 7 and 8, is lowered further the fingers 26a, 26b and the pushers 22a, 22b continue to move downward. Note that while fingers 26a, 26a grasp the leads 4, the grasp is not firm enough to prevent the fingers 26a, 26b from sliding downward on the leads when the plate 10 is lowered. The pushers 22a, 22b. will continue their descent and contact the leads 4 of component 1 (FIG. 4D). Upon further descent of the interface plate the pushers 22a, 22b will then be pushed up relative to the interface plate, resisted only by the deflection of their respective leaf springs. At this point the displacement of each pusher 22a, 22b relative to the interface plate is detected via the displacement sensors and examined to determine whether or not the component has been properly grasped. Given two different displacements from the pushers 22a, 22b it is probable a component lead is bent, as shown in FIG. 4E, or that the component is improperly positioned in the parts tray. If either of these situations exist, then the component will not be grasped properly by fingers 26a, 26b and this will be revealed through the difference in displacments between pushers 22a and 22b. Two equal displacements are indicative that the component 1 is properly grasped by the fingers 26a, 26b and ready for removal from the tray 31 and insertion into the awaiting PCB as shown in FIG. 4D. Note knowledge of the displacements also permits the force which the pushers are exerting onto the component leads to be determined and carefully controlled. At this point the component 1 may be vertically lifted from the tray, by lifting the entire apparatus with a mechanical arm attached to the interface plate, such that the pushers 22a, 22b remain in contact with the component leads and the fingers 26a, 26b maintain a grasp of the component (FIG. 4F).

Figure 4G:
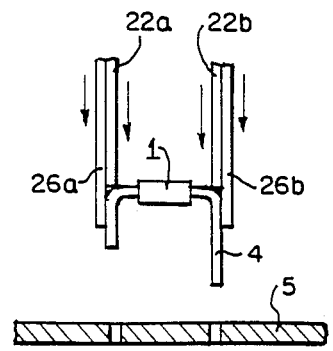
Figure 4H:
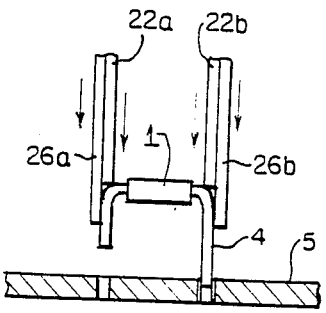
Figure 4J:
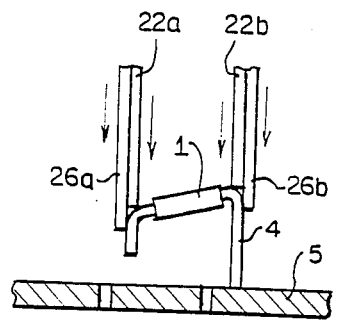
Figure 4K:
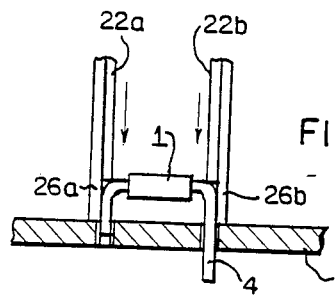
Figure 4L:
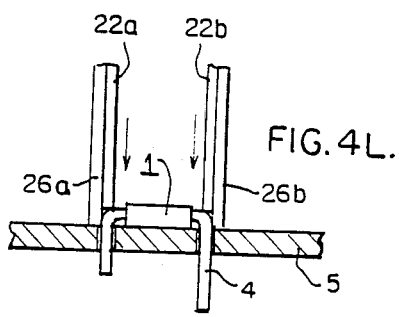
Figure 4M:
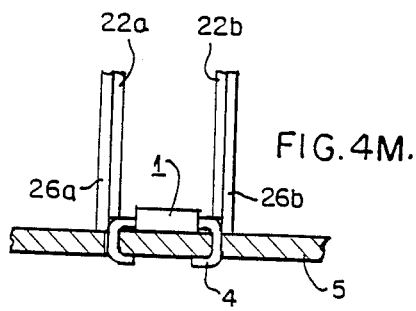

As mentioned earlier the entire retrieval and insertion apparatus is attached to a robotic arm as an end-effector. The robotic arm (not shown) is programmed to retrieve the component from a specific location, such as a parts tray, and to transport the component to a specific location over a PCB and then to insert the component into the PCB. The robotic arm provides precise movement that permits the apparatus to retrieve the component and then precise movement again to position the component in the region of the PCB through-holes. FIG. 4G shows the initial alignment for the component 1 into the through-hole PCB 5 after the component is retrieved from a parts tray. After the robotic arm transports the component to a location, ideally directly above the corresponding holes in the PCB 5, the arm is lowered so the component may be inserted, as shown in FIG. 4H. Occasionally the positioning of the component 1 is slightly off such that a lead misses a hole, as shown in FIG. 4J. In this case, the pushers 22a, 22b are deflected upward relative to the interface plate 10 due to the force on the longer lead from contacting the PCB 5. The component will cock slightly and cause one pusher 22a to stop or move upward relative to the interface plate causing a difference in displacement between the pusher 22a and pusher 22b, which through displacement sensors, will be detected. After this condition has been detected, the robotic arm temporarily suspends the vertical insertion and moves the component lead in a search pattern, such as a spiral, in an attempt to find the hole. If successful, the lead 4 drops into the hole 6 which relieves force on the pusher 22b causing the pusher 22b to displace slightly downward. This pusher 22b displacement indicting successful insertion of the lead is detected by a displacement sensor. If unsuccessful after a given time, the insertion attempt is aborted and the component rejected. When successful, which could occur at the first insertion attempt, the long lead is fed into the PCB hole as shown in FIG. 4H. At this point the apparatus continues its descent and the short lead is inserted into its hole in the same manner as the long lead was until both fingers 26a and 26b contact the surface of the PCB 5 as seen in FIG. 4K. The descent continues and the pushers 22a, 22b urge the component 1 further until the component bottoms out on the PCB as shown in FIG. 4L. At this point the pushers cannot move the component any further downward since the component is now resting on the PCB 5. The interface plate continues its descent thereby causing relative motion between the interface plate and the pushers 22a, 22b. This relative motion, which also deflects the respective springs associated with pushers 22a, 22b, is detected by displacement sensors (28a and 28b in FIG. 3). With the component held securely by the servo-fingers and pushers a separate mechanism then cuts and clinches the component into a configuration similar to that in FIG. 4M.

Figure 4N:
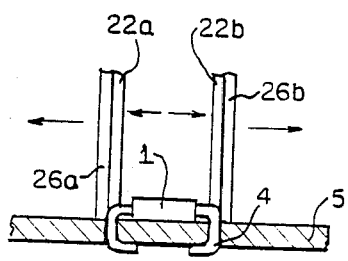
Figure 4P:
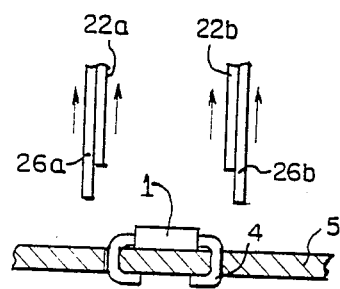

With the cut and clinch operation completed the component is installed and ready for soldering. The insertion and retrieval apparatus is removed from the component by moving the fingers 26a, 26b laterally a small amount to disengage the component 1 as shown in FIG. 4N. Note in the process the pushers 22a, 22b are also laterally displaced. The apparatus is then moved upward (FIG. 4P) thereby completing the insertion sequence. The retrieval and insertion sequence is then repeated for the next component.

Figure 5A:
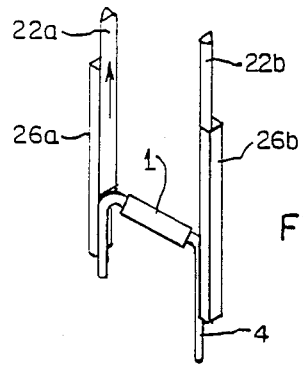
FIGS. 5A, 5B and 5C illustrate how the apparatus secures differently shaped components, such as an axial component in FIG. 5A, a radial component in FIG. 5B and a can-type component in FIG. 5C.
Figure 5B:
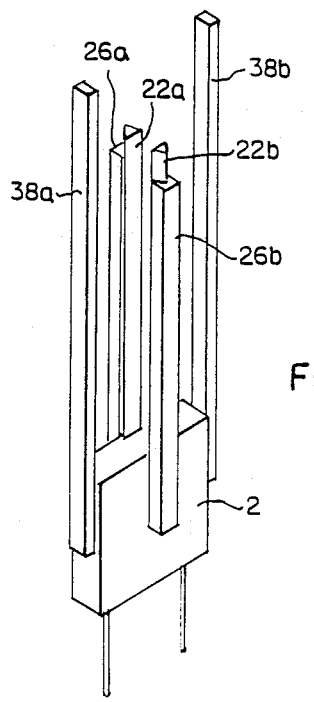
Figure 5C:
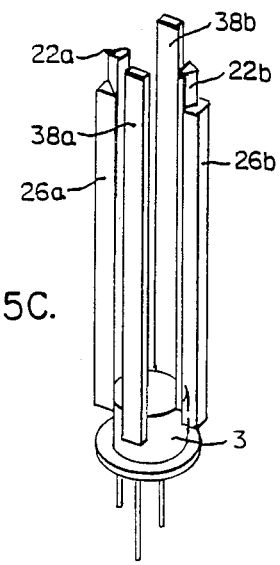

For electronic components other than axial lead components, such as 2 and 3 in FIG. 1, in order to properly grab and center the components another set of fingers, called pneumatic fingers, is required. The pneumatic finger assembly is shown as item 9 in FIG. 2. While FIG. 5A illustrates the manner in which an axial component 1 is grasped by the servo-finger assemblies, FIGS. 5B and 5C show how a radial component 2 and a can-type component 3 are secured by two pairs of fingers. Note in FIG. 5B pushers 22a and 22b contact the top of the component 2 while fingers 26a and 26b are holding the outside of the component 2. Another set of fingers 38a and 38b hold the component 2 at right angles to fingers 26a and 26b. This second set of fingers 38a, 38b is part of the pneumatic finger assembly 9 found in FIG. 2 and will be further explained with FIG. 8. For reference a third axis 39 is defined and indicates the direction of travel for fingers 38a, 38b. Axis 39 is perpendicular to both axis 21 and axis 23 (see FIG. 2). In FIG. 5C the same finger arrangement is used.

Note the pneumatic cylinders (one, 34a, of which is shown in FIG. 3) are used to position the fingers 26a, 26b so that the ends of the fingers 26a, 26b are closer to the ends of the pushers 22a, 22b. The pneumatic cylinders are activated before the retrieval and insertion process begins to adapt the apparatus to pick up components having brims, such as component 3 in FIG. 1. In essence the pneumatic cylinders activate and shorten the length of fingers 26a, 26b relative to the pushers 22a, 22b thereby allowing the apparatus to grasp a component with a brim using the fingers 26a, 26b and simultaneously positioning the pushers 22a, 22b relatively close to the top of the component. While it is possible to retrieve and insert components with a brim, such as component 3 in FIG. 1, without a design utilizing the cylinders, using the cylinders to retract the fingers 26a, 26b permits the design of a longer finger 26a, 26b to better grasp components of other types.

Figure 6:
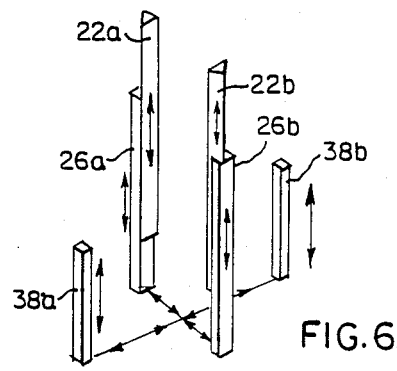
FIG. 6 shows the entire range of motion of all of the fingers used in the retrieval and insertion apparatus.
Figure 7:
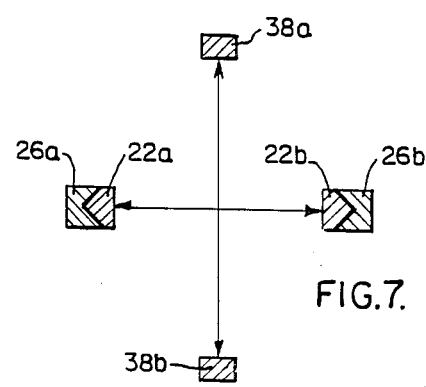
FIG. 7 shows the permissible lateral movement between the fingers in the apparatus.

FIG. 6 shows the entire set of fingers and their directions of travel. The relative motion in the lateral direction of the set of fingers is shown in FIG. 7. FIG. 7 shows a cross-sectional view of the fingers 26a, 26b, 38a and 38b and the pushers 22a, 22b.

While pushers 22a, 22b and fingers 26a, 26b have been discussed fingers 38a, 38b have not. Because these fingers act together and are structurally similar the "a", "b" nomenclature will be utilized in describing them.

Figure 8:
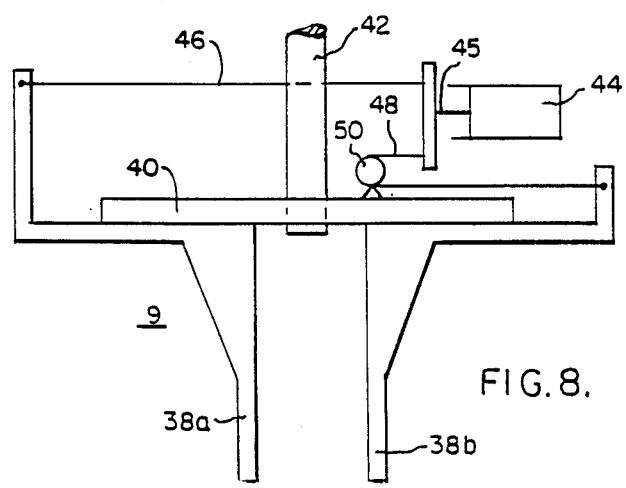
FIG. 8 shows a schematic of the pneumatic finger assembly indicated as item 9 in FIG. 2.

FIG. 8 shows a schematic representation of the pneumatic finger assembly 9, also shown in FIG. 2, used to move fingers 38a, 38b. Note that unlike pushers 22a, 22b and fingers 26a, 26b there are no displacement sensors associated with these fingers. These fingers 38a, 38b are used only when a radial or can-type component must be retrieved and inserted and then they are used primarily to center the component. Unlike grasping an axial component where the V-grooves in the servo-fingers 26a, 26b act to center the component in a first direction and also close upon a fixed center thereby centering the component in a second direction at right angles to the first, grasping a radial or can-type component is different since the V-grooves of the servo fingers 26a, 26b do not assist. Due to slight deviations in the location of a component in a parts tray, when the servo-fingers 26a, 26b grasp a component, the component may not be entirely centered within the fingers. Both sets of fingers 26a, 26b and 38a, 38b close upon a fixed imaginary center point. For this reason the pneumatic fingers 38a, 38b are utilized and act to center the component in the direction at right angles to the servo-fingers axis. The pneumatic fingers 38a, 38b are slidably mounted to a rail on a base plate 40. The plate 40 is attached to and supported by a sliding shaft 42 which moves the entire pneumatic finger assembly 9 up and down. A pneumatic cylinder 44 having a pneumatic cylinder shaft 45 pulls two cords 46 and 48. Cord 46 is attached to finger 38a, via pulleys (not shown), thereby able to pull finger 38a toward the opposing finger 38b. Cord 48 is looped through a series of pulleys, only one 50 shown, attached to the base plate 40 and then attached to finger 38b, thereby able to pull finger 38b toward finger 38a, resulting in a squeezing motion.

Note that the pneumatic finger assembly is primarily to center components for the insertion process. The force of the servo-fingers 26a, 26b alone is adequate to insert the component into a PCB and hold it during the cut and clinch operation. The entire pneumatic finger assembly is vertically retractable using a pneumatic cylinder (item 61 in FIG. 2) so that when space restrictions dictate, only the servo-fingers will grasp the component. This is important during component insertion where the components are spaced closely together and it is desirable to manipulate the component with the fewest fingers possible for fear of interference with already inserted components. The pneumatic cylinder (not shown) attached to shaft 42 is utilized to place the pneumatic fingers in either the operating position level with the servo-fingers or retracted upwardly away from the level of the servo-fingers, allowing the servo-fingers to operate entirely independently of the pneumatic fingers.

Furthermore note that servo-motor and lead screws discussed with FIG. 3 to controllably close the servo-fingers are necessary only for the required controlled compression of the servo-fingers upon the leads of an axial component. Absent the need to grasp axial leads, a pneumatic cylinder and a sliding mechanism arrangement similar to that in the pneumatic finger assembly 9 of FIG. 2 would be sufficient.

FIG. 2 presents an isometric view of the entire retrieval and insertion apparatus in order to show the inter-relationship between the interface plate 10, the servo-finger assemblies 7 and 8, and the pneumatic finger assembly 9. The schematic drawings in FIGS. 3 and 8 represent the assemblies 7 (or 8) and 9 respectively found in FIG. 2. For clarity the elements of the isometric will be associated with their respective elements from the schematic drawings, although note a side view of assembly 7 found in FIG. 9 highlights the main elements and will be used to discuss the elements of assembly 7, since some important elements are hidden in the isometric view. Looking at FIG. 9 the feed screw 11 is threaded through a bore in the frame 17a. The frame 17a extends the length of the assembly 7. The entire frame 17a may be translated along the leadscrew 11 axis through rotation of the screw 11 by means of a servo-motor (not shown). Slidably connected to the frame 17a through a post (not shown) vertically fixed to the frame 17a, the servo-finger 26a is free to move vertically, resisted only by the force of the compression spring 20a which is urged against the frame 17a by any upward vertical motion of the finger 26a. The relative displacement of the finger 26a relative to the frame 17a is measured by the displacement sensor 30a. A preferred embodiment of the sensor 30a is comprised of a linear potentiometer 32a fixed to the frame 17a with a slider post 33a fixed to the finger 26 and guided by the potentiometer 32a such that displacement of the finger 26a will displace a slider inside the potentiometer 32a and the resultant resistance change will be used to determine displacement. A subminiature pneumatic cylinder 34a is used to move the finger 26a upward absent any externally applied force to the finger 26a itself.

Attached to the frame 17a by two cantilevered leaf springs 19a is another finger 22a, also called a pusher. Note that while the pusher 22a and the finger 26a move laterally as one unit, they are free to move independently and separately in the vertical direction. When a sufficient upward vertical force is placed on the pusher 22a, such as during component insertion, this force causes vertical deflection of pusher 22a against the spring 19a. Attached to the pusher 22a is a displacement sensor 28a. A preferred embodiment of the sensor 28a is comprised of a magnet 62 which is connected to the pusher 22a and moves with pusher 22a such that it passes across the face of a Hall-effect sensor device 64 fixed to the frame 17a. This type of sensor detects a slight voltage change with small movement of a magnet over the sensor. This type of sensor can effectively detect movements as low as 0.060 inches.

The output from both of the displacement sensors 28a and 30a is utilized to provide the tactile ability of the retrieval and insertion apparatus but it further provides information on the displacement of the component during the maneuvering operation so that the proper position of the component may be monitored and checked. Furthermore information from these sensors reveals whether or not the component leads have entered the respective through-hole on the PCB. Note again that this servo-finger assembly 7 designated with "a" suffixes is similar to assembly 8 designated by "b" suffixes except it is a mirror image.

The pneumatic assembly 9 in FIG. 2 acts to assist the servo-fingers by centering a radial or can component during retrieval and insertion. Functionally the pneumatic fingers are required during component insertion until all leads are entered into the PCB holes. Once all leads are in the PCB holes the entire pneumatic fingers assembly 9g can be retracted upward to prevent interference with previously inserted parts. At this point the component can be seated firmly to the PCB using only the servo-fingers 26a, 26b. As discussed before, FIGS. 5A and 5B show the pneumatic fingers 38a and 38b in position around a radial component 2 and a can-type component 3, respectively.

The entire pneumatic finger assembly 9 shown in FIG. 2 is supported by the sliding shaft 42 which is attached to a pneumatic cylinder 61 mounted on the interface plate 10 which vertically positions the assembly such that the fingers 38a and 38b are level with the servo-fingers 26a and 26b or such that the fingers 38a and 38b are raised above the servo-fingers 26a and 26b into a retracted position. A base plate 40 is attached to the shaft 42 and to this is mounted another pneumatic cylinder 44 having a shaft 45. Note the base plate 40 is vertically guided in another location (not shown) to prevent the assembly from rotating about shaft 40. Two cords 46 and 48 are secured to the cylinder shaft 45. The cord 46 is reeved through a series of pulleys and pulls the finger 38a which is slidably attached to the plate, causing the finger 38a to move to the right. On the other hand the cord 48, also reeved through pulleys, pulls the finger 38b which is slidably attached to the base plate 40 such that the retracting pneumatic cylinder causes the finger 38b to move toward finger 38a. Retraction of the pneumatic cylinder 44 causes fingers 38a and 38b to move together in a clamping fashion. A limit switch 53 is secured to the base plate 40 such that at the extreme end of the travel range for the finger 38a, the switch will be activated, signifying the fingers are in an open position.

An interface plate 10 is used as a foundation for the servo-finger assemblies 7 and 8 and the pneumatic finger assemblies The servo-finger assembly 7 is attached to the interface plate 10 through brackets which act to guide shafts 12, 13 and a sliding shaft 75 respectively. A servo-motor (not shown) mounted on the plate 10 is used to drive shaft 16 which acts to move the fingers 26a and 26b together or apart based on the rotation of the feed screws 12, 13 attached to the frames 17a and 17b. Note the servo-motor (not shown) utilizes a closed-loop control system for better monitoring and better accuracy.

In order to determine the vertical position of the pneumatic finger assembly 9 there is a microswitch 74 located on the base plate 40 such that upon retraction the switch is raised against an extension from the interface plate 10 and the switch is activated. In order to detect whether the servo-fingers are open or closed another microswitch 76 is mounted to the interface plate 10 so that when the frame 17a is moved outwardly by the lead screw 12, at the extreme range of travel the microswitch is contacted and activated by the frame 17a thereby indicating that the servo-finger 26a connected to frame 17a is in the open position. Since the lead screws 11 and 12 advance their respective frames 17a and 17b at the same rate, when finger 26a connected to frame 17a is in an open position so is finger 26b connected to frame 17b.

Finally note the servo-fingers 26a, 26b are vertically guided with posts 27a, 27b and restrained from movement with springs 20a, 20b with any displacement measured using displacement sensors 30a, 30b. On the other hand the pushers 22a, 22b are vertically guided in the restricted path caused by leaf springs 19a, 19b and restrained from movement with these same leaf springs 19a, 19b with any displacement measured using displacement sensors 28a, 28b. Both the pushers 22a, 22b and the fingers 26a, 26b overcome spring forces and are linearly displaced with the displacement detected using sensors. For this reason the arrangements to guide and record displacement for each set of pushers and fingers are interchangeable and consequently the spring, guiding or sensing devices may be independently interchanged.

What is claimed is:

1. A tactile retrieval and insertion device for the retrieval and placement of electronic components into through-hole printed circuit boards comprising:
   (a) a supporting means;
   (b) at least two cooperating assemblies slidably attached to said supporting means in a direction parallel to a first axis, each of said assemblies comprising:
      (i) a frame;
      (ii) a first subframe having a first elongated finger with an extended end for clamping the component;
      (iii) a first guiding means attaching said first subframe to said frame and permitting movement of said first subframe relative to said frame in a direction parallel to a second axis, said second axis being perpendicular to said first axis;
      (iv) a first spring means between said first subframe and said frame to resist relative movement between said first subframe and said frame;
      (v) a first means for measuring the relative displacement, parallel to said second axis, of said first subframe relative to said frame;
      (vi) a second subframe having a second elongated finger with an extending end for pushing the component, said second subframe oriented such that said second finger abuts said first finger and said extending end of said second finger resting above said extending end of said first finger;
      (vii) a second guiding means attaching said second subframe to said frame and permitting movement of said second subframe relative to said frame in a direction parallel to said second axis;
      (viii) a second spring means between said second subframe and said frame to resist relative movement between said second subframe and said frame;
      (ix) a second means of measuring the relative displacement, parallel to said second axis, of said second subframe relative to said frame;
   (c) a means for moving said assemblies together or apart along said first axis.

2. The device of claim 1 further comprising:
   a gripping means having a pair of fingers, each said finger being movable along a third axis, said third axis being perpendicular to said first axis and said second axis.

3. A tactile retrieval and insertion device for the retrieval and insertion of electronic components into through-hole printed circuit boards comprising:
   (a) a supporting means through which the entire apparatus may be maneuvered;
   (b) at least two cooperating assemblies slidably attached to said supporting means in a direction parallel to a first axis and used for grasping an electronic component while furthermore providing information to verify proper retrieval and insertion of an electronic component, each of said assemblies comprising:
      (i) a frame;
      (ii) a first subframe having a first elongated finger with an extending end for clamping the leads on an axial component or for clamping the body on other types of components;
      (iii) a first mounting means attaching said first subframe to said frame and permitting movement of said first subframe relative to said frame in a direction parallel to a second axis, said second axis being perpendicular to said first axis, such that a compressive force, caused by contact during component retrieval or insertion between said extending end of said first elongated finger and a printed circuit board or a component improperly aligned during insertion into a printed circuit board, in a direction parallel to said second axis against said extending end of said first elongated finger will displace said first subframe relative to said frame;
      (iv) a first means for measuring the relative displacement, parallel to said second axis, of said first subframe relative to said frame wherein said first means for measuring provides information to evaluate the position and orientation of said assembly and of said electronic component;
      (v) a second subframe having a second elongated finger with an extending end for pushing the component, said second subframe oriented such that said second finger is disposed in an abutting parallel relationship with said first finger, with said extending end of said second finger being space above said extending end of said first finger;
      (vi) a second mounting means attaching said second subframe to said frame and permitting movement of said second subframe relative to said frame in a direction parallel to said second axis, such that a compressive force, caused by contract during component retrieval or insertion between said extending end of said second elongated finger and one axial lead of an axial component or the body of another component, in a direction parallel to said second axis against said extending end of said second elongated finger will displace said second subframe relative to said frame;
      (vii) a second means of measuring the relative displacement, parallel to said second axis, of said second subframe relative to said frame wherein said second means for measuring provides further information to evaluate the position and orientation of said electronic component;
   (c) a means for moving said assemblies together or apart along said first axis, such that the component may be grasped or released based on the movement of said assemblies along said first axis.

4. The apparatus according to claim 3 wherein at least one of said first or said second mounting means includes a post and a spring wherein said post is attached to said frame and is in slidable engagement with a predetermined one of said subframes and wherein said coil spring is oriented in a direction parallel to said second axis and is attached at one end to said frame and at the other end to the predetermined one of said subframes such that the predetermined one of said subframes is permitted to slide relative to said frame and the sliding motion is resisted by said coil spring.

5. The apparatus according to claim 3 wherein at least one of said first or said second mounting means includes a pair of parallel spaced-apart leaf springs, each oriented in a direction parallel to said first axis, fixed at one end to said frame and fixed at the other to a predetermined one of said subframes such that the predetermined one of said subframes is permitted to move relative to said frame in a direction parallel to said second axis and movement is resisted by said leaf springs.

6. The apparatus according to claim 3 wherein at least one of said first or said second measuring means includes a linear potentiometer attached to said frame and to a predetermined one of said subframes such that movement between said frame and the predetermined one of said subframes may be monitored.

7. The apparatus according to claim 3 wherein at least one of said first or second measuring means includes a Hall effect displacement sensor device having a magnet and a sensor, each mounted to said frame and to a predetermined one of said subframes such that movement between said frame and the predetermined one of said subframes may be monitored.

8. The apparatus according to claim 3 wherein said first elongated finger includes a longitudinal groove in the surface of said first finger abutting said second finger, and said second finger includes a tongue surface portion fitting within said groove of said first finger such that in grasping an electrical component having axial leads, one of the leads fits into said longitudinal groove of said first finger.

9. The apparatus according to claim 3 wherein the means for moving said assemblies together or apart along said first axis includes at least a pair of threaded shafts oriented parallel to said first axis mated with at least a pair of corresponding internally threaded openings in each of said frames and at least a pair of mounting plates on said supporting means for accepting threaded shafts, each threaded shaft connected to a gear train having a drive shaft for imparting rotation to said shafts and translation to said assemblies.

10. The apparatus according to claim 3 further comprising:
a gripper means slidably attached in a direction parallel to said second axis to said supporting means and having a pair of fingers, each said finger being movable along a third axis, said third axis being perpendicular to said first axis and said second axis wherein said gripper means is used to grasping and centering electronic components not having axial leads.

11. A tactile retrieval and insertion device for the retrieval and insertion of electronic components into through-hole printed circuit boards comprising:
(a) a supporting means through which the entire apparatus may be maneuvered;
(b) at least two cooperating assemblies slidably attached to said supporting means in a direction parallel to a first axis and used for grasping an electronic component while furthermore providing information to verify proper retrieval and insertion of an electronic component, each of said assemblies comprising:

(i) a frame;
(ii) a first subframe having a first elongated finger with an extended end for clamping the leads on an axial component or for clamping the body on other types of components;
(iii) a first mounting means including a post attached to said frame and said post slidably attached to said first subframe and a coil spring oriented in a direction parallel to attached at one end to said frame and at the other end to said first subframe such that said first subframe is permitted to slide relative to said frame and sliding motion is resisted by said coil springs;
(iv) a first means for measuring the relative displacement, parallel to a said second axis, of said first subframe relative to said frame, said first means including a linear potentiometer attached to said frame and to said first subframe such that movement between said frame and said first subframe may be monitored to verify proper retrieval and insertion of an electronic component;
(v) a second subframe having a second elongated finger with an extending end for pushing the component, said second subframe oriented such that said second finger abuts said first finger and said extending end of said second finger resting above said extending end of said first finger;
(vi) a second mounting means including a pair of leaf springs, each oriented in a direction parallel to said first axis, fixed at one end to said frame and fixed at the other end to said second subframe such that said second subframe is permitted to move relative to said frame in a direction parallel to said second axis and movement is resisted by said leaf springs;
(vii) a second means of measuring the relative displacement, parallel to said second axis, of said second subframe relative to said frame, said means including a Hall effect displacement sensor device having a magnet and a sensor, each mounted to said frame and to said second subframe such that movement between said frame and said second subframe may be monitored to verify proper retrieval and insertion of an electronic component.

12. A method of tactile retrieval of multisized, multishaped electronic components resting in known orientations and positions into through-hole printed circuit boards using an assembly having a first set of resilient displacement sensitive fingers, called servo-fingers, for gripping the component and a recessed resilient second set of displacement sensitive fingers, called pushers, for pushing the component, each set of fingers being slidably attached to a frame along a common axis to permit retraction and expansion of the fingers about a component comprising:
(a) advancing the assembly toward the PCB with the servo-fingers gripping the component until the servo-fingers contact the PCB, indicating by the relative displacement of each servo-finger that the component leads have entered their respective PCB holes;
(b) further advancing the assembly toward the PCB with the servo-fingers gripping the component until the pusher fingers contact the component body indicated by the relative displacement of the pusher fingers;
(c) further advancing the assembly toward the PCB with the pusher fingers contacting the component and sliding the component through the servo-fingers until the pusher fingers are stopped as the component contacts the PCB, indicating by the relative displacement of each pusher finger and each servo-finger that the component body has contacted the PCB and the component is properly seated;

(d) holding the assembly stationary thereby urging the component against the PCB while maneuvers to attach the component to the PCB are executed.

13. A method as in claim 12, and further comprising the steps in preparation for said advancing the assembly as in step (a) of:

(a) advancing the assembly toward the PCB with the servo-fingers gripping the component until the pusher fingers are unequally displaced, indicating a lead from the component has missed a hole and the lead has contacted the PCB thereby cocking the component and unequally deflecting the pusher fingers;

(b) moving the assembly in a search pattern to locate the hole associated with the misdirected lead.

14. A method as in claim 12, and further comprising the steps in preparation for said advancing the assembly as in step (a) of:

(a) locating the assembly next to the component with each servo-finger on a side of the component;

(b) gripping the component by retracting the servo-fingers onto the component, with the component vertically supported by and resting in a tray;

(c) lowering the assembly so the servo-fingers slide on the component and the pusher fingers contact the top of the component;

(d) confirming whether or not the component is properly grasped utilizing the displacement of the two pushers relative to each other;

(e) transporting the component to a location above a PCB.

* * * * *